United States Patent [19]
Roger et al.

[11] Patent Number: 5,175,673
[45] Date of Patent: Dec. 29, 1992

[54] DISTRIBUTOR FOR USE IN COMMUNICATION SYSTEMS

[75] Inventors: Jacques Roger, Guyancourt, France; Günter Steffen, Hemmingen, Fed. Rep. of Germany

[73] Assignee: Alcatel N.V.

[21] Appl. No.: 759,600

[22] Filed: Sep. 16, 1991

[30] Foreign Application Priority Data

Oct. 10, 1990 [EP] European Pat. Off. ........ 90204830.5

[51] Int. Cl.⁵ .................................................. H05K 9/00
[52] U.S. Cl. ............................... 361/424; 174/35 MS; 361/390
[58] Field of Search ............. 174/35 R, 35 MS, 59; 312/223; 361/334–342, 355, 390, 424; 379/325–330; 439/4, 110, 120, 121

[56] References Cited

U.S. PATENT DOCUMENTS

| | | | |
|---|---|---|---|
| 2,567,740 | 9/1951 | Smith, Jr. | 361/334 |
| 2,756,369 | 7/1956 | Gorrie | 361/334 |
| 4,002,856 | 1/1977 | Sedlacek et al. | 361/390 |
| 4,390,755 | 6/1983 | Pierresteguy | 361/334 |
| 4,605,275 | 8/1986 | Pavel | 339/119 |
| 4,679,867 | 7/1987 | Heldenbrand et al. | 312/287 |
| 4,712,232 | 12/1987 | Rodgers | 379/329 |
| 4,761,516 | 8/1988 | Reichert | 174/35 |

FOREIGN PATENT DOCUMENTS

| | | | |
|---|---|---|---|
| 1252770 | 10/1967 | Fed. Rep. of Germany | 361/334 |
| 2147336 | 3/1973 | Fed. Rep. of Germany | |
| 2911444 | 10/1985 | Fed. Rep. of Germany | |
| 2452230 | 10/1980 | France | |
| 0373757 | 6/1932 | United Kingdom | 379/327 |
| 2234636 | 2/1991 | United Kingdom | 361/424 |

OTHER PUBLICATIONS

Wolpers, "Verteiler in Kommunikationsnetzen," 1234 Nachrichten Elektronik & Telematik 40 (1986) Dez. No. 12, pp. 523–527.

Brokkelkamp et al., "Electro-magnetic compatibility in Design 400-slim," Phillips Telecommunication Review, vol. 43, No. 1, Apr. 1985, pp. 42–46.

Primary Examiner—Leo P. Picard
Assistant Examiner—D. Sparks
Attorney, Agent, or Firm—Spencer, Frank & Schneider

[57] ABSTRACT

The distributor is provided for the connection of external and internal cables for shielded cabinets employed in communication systems. It is composed of a cabinet-like housing having a door that is fastened in the cabinet, and of bars as carriers of plug-in connectors and blind bars. The bars have a U-shaped profile and are arranged to be inserted and locked in the rear wall of the housing. Together with the rear wall and the bottom plate of the housing, they form a shielding wall at which the external lines can be plugged into the plug-in connectors from the front (outside) while the internal lines are brought to it from the rear (inside).

9 Claims, 2 Drawing Sheets

DISTRIBUTOR FOR USE IN COMMUNICATION SYSTEMS

CROSS REFERENCE TO RELATED APPLICATION

This application claims the priority of Application Ser. No. EP 90/402,830.5, filed Oct. 10, 1990, in the Federal Republic of Germany, the subject matter of which is incorporated herein by reference.

BACKGROUND OF THE INVENTION

The present invention relates to a distributor in particular for use in communication systems.

DE-OS [German Laid-Open Patent Application] 2,147,336 discloses a distributor for communication systems in which connecting elements are attached in a regular arrangement on a rack, with the incoming and outgoing conductors or cables being brought to these connecting elements. The rack is formed by rack bars which extend vertically and horizontally in the customary manner and rest on the floor of the room in which they are set up. The connecting elements are separators or switches or simple throughput distribution modules which are open and are arranged next to and above one another. Lanes remain between them for guiding the conductors.

Often such communication racks are supplemented by sheet medal casings to form cabinets Such cabinets or cabinet racks are disclosed, for example, in DE 2,911,444.A1 which relates to individual cabinets as well as to cabinet modules that can be arranged in a row. At their frontal faces, the cabinets are generally equipped with doors, at the rear only if necessary and only depending on the way they are set up, free-standing or along a wall.

In the latter case, stationary metal encasing sheets are attached, also to the sides. In the past, in addition to their aesthetic effect, these casings performed only a protective function from a mechanical point of view, but since the advent of digital technology, they become increasingly more important as a shield against interfering electromagnetic radiation.

Cable and conductor inlets are of particular importance in connection with shielding measures, for example at the distributor, so as to ensure that the passages through the shielding are electromagnetically tight.

SUMMARY OF THE INVENTION

It is therefore an object of the present invention to provide a telecommunication system distributor that is reliably shielded against interfering radiation, is suitable for the accommodation of different conductors and plug-in connectors and is simple to manufacture. This is accomplished by a distributor including a distributor housing open at a top thereof, for mounting in an electromagnetically shielded cabinet, the distributor housing being provided with a door at a front thereof, a plurality of bars arranged in vertical juxtaposition along a rear wall of the distributor housing, the bars each forming an internal hollow space with the rear wall, an upper end face of the bars being closed and a lower end face of the bars being open, the bars having one of plug-in connectors and switching devices mounted thereon, and a bottom plate disposed at a bottom of the distributor housing for closing the distributor housing at the bottom in front of the bars, wherein permanently connected internal lines extend downwardly within the bars and out of the distributor housing through the open lower end faces of the bars, and external lines for connection to plug-in connectors enter the distributor housing from the open top thereof.

BRIEF DESCRIPTION OF THE DRAWINGS

The invention will now be described for one embodiment thereof that is illustrated in the associated drawing figures. It is shown in.

DETAILED DESCRIPTION OF THE PREFERRED EMBODIMENT

Figure 1:
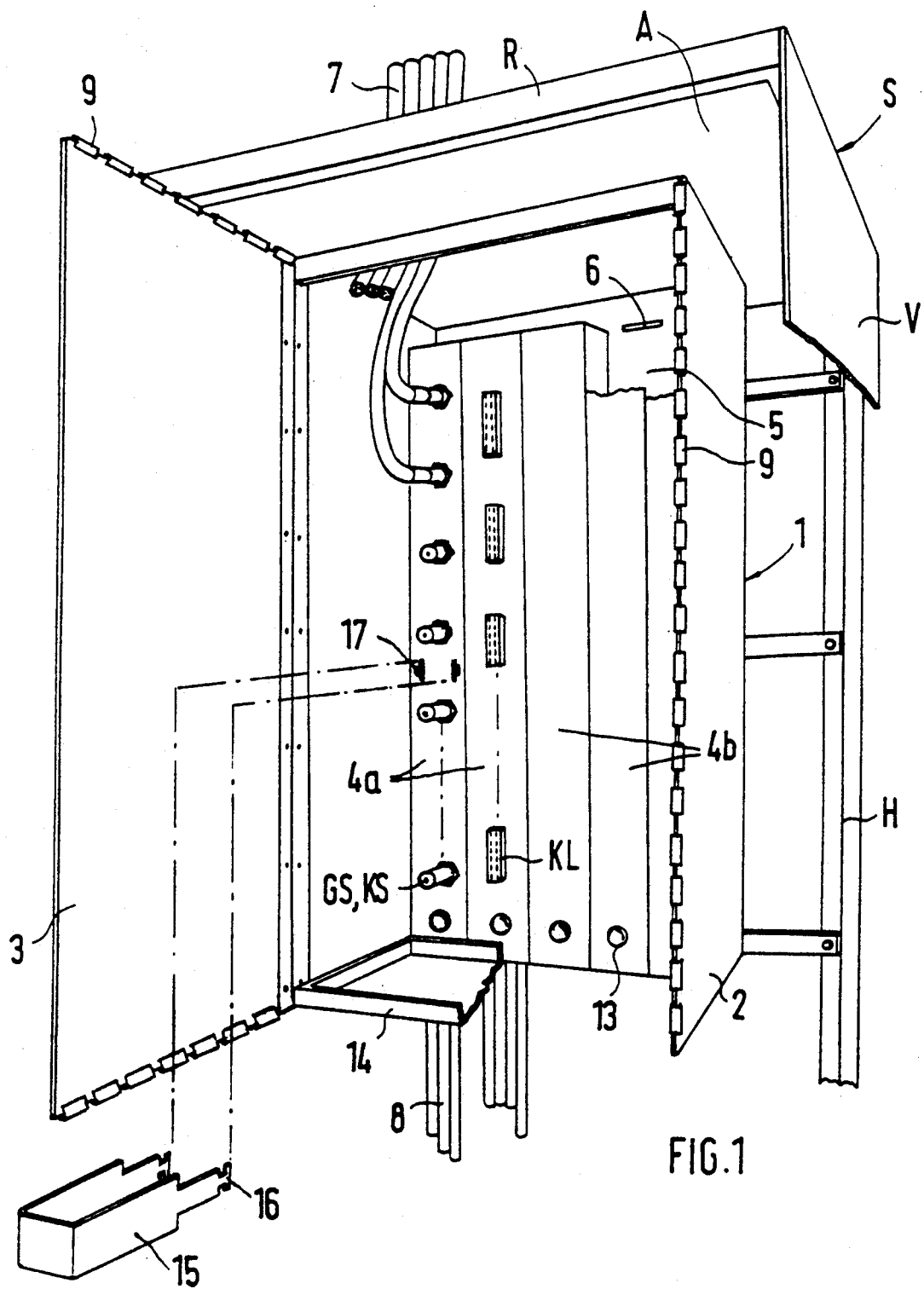
FIG. 1, a perspective sectional view of a communication system cabinet including an inserted, shielded distributor whose housing door is open, offering a view of the bars, some equipped with plug-in connectors for the connection of external lines.

The distributor 1 shown in FIG. 1 is installed in a communication system cabinet S that is shielded to provide for EMC [electromagnetic compatibility]. Only a section of this cabinets is shown including the components adjacent to distributor 1 such as, for example, the upper frame R, part of a vertical strut H and part of the cabinet casing V. The upper frame R is closed by metal covering sheets A up to the housing 2 of distributor 1.

Distributor 1 is composed of a cabinet-like housing 2 which has a door 3 at the front and bars 4a accommodated in its interior which serve as supports for plug-in connectors and possibly also for switching devices (not shown). Moreover, blind bars 4b are also provided whose function will be described below. Housing 2 is open at the top and is closed at the bottom by a removable bottom plate 14. The latter may be configured as a slide and may be insertable from the front or removed toward the front when door 3 is open. Housing 2, door 3 and bottom plate 14 are advisably manufactured of stainless steel.

The parting grooves between housing 2, door 3 and bottom plate 14 are electrically sealed with the aid of commercially available contact springs 9 (e.g. as disclosed in PCT 85/00378) or by contact spring strips.

The cables or lines are guided from the top and bottom into the housing 2 of distributor 1, for example, the external lines 7 from the top through the housing opening and the internal lines 8 (intraframe connections) from the bottom into bars 4a.

Figure 2:
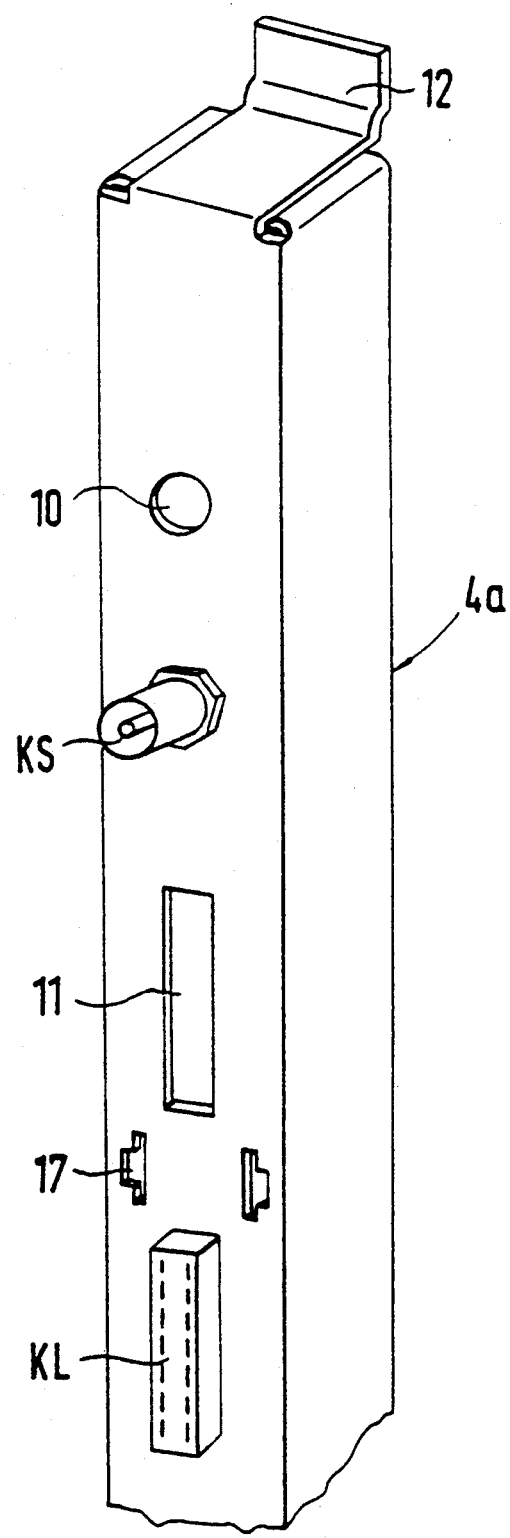
FIG. 2, is a perspective view of a bar of the distributor according to FIG. 1 which is equipped with openings for the insertion of, and is in part equipped with, different types of plug-in connectors.

Bars 4a and 4b have a U-shaped profile and are likewise advisably made of stainless steel. The bars are arranged vertically directly next to one another along the rear wall 5 of housing 2. While the respective lower end face of bars 4a and 4b is open, the upper end face is closed and is provided with a flap 12, which projects outwardly beyond the plane in which the free arms of the profile end and extends outwardly parallel to this plane as can be seen in FIG. 2.

In the upper region of the rear wall 5 of housing 2 transversely extending slots 6 (FIG. 1) are provided into which the flaps 12 of bars 4a and 4b can be inserted. The spacing between slots 6 is of such dimensions that bar comes to lie against bar. Near the lower end, each bar 4a or 4b is equipped with a conventional push-type locking bolt 13 which when depressed fixes the bar to rear wall 5. Since the open U-shaped profile of bars 4a faces rear wall 5 when bars 4a are inserted, a channel is created in each case in which the internal lines 8 can be brought to plug-in connectors KL or KS.

In addition to bars 4a which can be equipped with plug-in connectors, a minimum arrangement also uses blind bars 4b which cannot be equipped with plug-in connectors (FIG. 1). These are used to fill up the bar locations in distributor 1 that are not occupied.

Bars 4a are provided with appropriate openings for the installation of the plug-in connectors, such as glass fiber connectors or connecting sleeves GS, coaxial connectors or plug-in sleeves KS, contact strips KL and the like. FIG. 2 shows a part of a bar 4a for mixed equipment. It has round openings 10 for glass fiber type plug-in connectors GS or coaxial line connectors KS, and rectangular openings 11 for contact strips KL. However, in FIG. 1, bars 4a are shown which are provided exclusively for glass fiber connectors GS or coaxial connectors KS as well as bars intended exclusively for plug-in contact strips KL. Before installation in distributor 1, bars 4a are equipped with plug-in connectors GS, KL, KS, lines 8 and switching devices so that they can be inserted by means of a few manipulations with all wiring already connected.

After all bars 4a and 4b have been inserted into distributor 1, bottom plate 14 is pushed in, thus closing the remaining bottom opening in housing 2 between bars 4a and 4b as well as door 3. In this way, a continuous shield is created between the external region and the internal region. Therefore, the region in which the external lines 7 are attached to plug-in connectors KL, KS, GS is an open chute defined by door 3, the side walls of housing 2, bars 4a and 4b and bottom plate 14, while the region in which internal lines 8 are disposed is divided into several chutes that are open at the bottom and are each formed by bars 4a and rear wall 5. This modular configuration permits the realization of a flexible distribution of the lines in an area that is insensitive to interfering radiation.

If required, cable holders 15 may be attached to bars 4a in order to make an orderly arrangement of external lines 7. The cable holders 15 are U-shaped bars made of sheet metal or plastic whose free ends are each provided with a T-shaped attachment 16. Bars 4a are provided with at least one pair of T-shaped, diverging slots 17 disposed near the front edge of the bar. In the embodiment illustrated in FIG. 1, slots 17 lie approximately in the center of the bar. They may also be attached further up where the bundle of incoming lines is still thickest. If several pairs of slots 17 are distributed over the length of the bar, a cable holder 15 or two, if required, may be employed at suitable locations. The insertion is effected simply by slightly pressing together the free arms of cable holder 15 which has been pushed over lines 7 until attachments 16 fit into the vertical portions of slots 17 and can be inserted until they encounter a stop. When released, the free arms spring apart again while the undercut portions of the T-shaped attachments 16 slide into the horizontal portions of the T-shaped slots 17. With this engaging connection the cable holder 15 is fixed to bar 4a. Cable holders 15 can be employed to arrange external lines 7 into neat bundles.

Door 3, as well as the bars 4a, 4b, may be provided with at least one push-type locking bolt 13 which, when depressed, fixes the closed door to the housing (not shown). Other possibilities for locking the door are, for example, rotary locking bolts, locks, magnetic locks, etc.

It will be understood that the above description of the present invention is susceptible to various modifications, changes and adaptations, and the same are intended to be comprehended within the meaning and range of equivalents of the appended claims.

What is claimed is:

1. A distributor including connection elements for electrical connection of external and internal lines, for use in cabinets employed in electrical communication systems, the distributor comprising:
 a distributor housing open at a top thereof, for mounting in an electromagnetically shielded cabinet, the distributor housing being provided with a door at a front thereof;
 a plurality of bars arranged in vertical juxtaposition along a rear wall of the distributor housing; the bars each forming an internal hollow space with the rear wall, an upper end face of the bars being closed and a lower end face of the bars being open; the bars having one of plug-in connectors and switching devices mounted thereon; and
 a bottom plate disposed at a bottom of the distributor housing for closing the distributor housing at the bottom in front of the bars;
 wherein permanently connected internal lines extend downwardly within the bars and out of the distributor housing through the open lower end faces of the bars, and external lines for connection to plug-in connectors enter the distributor housing from the open top thereof.

2. A distributor according to claim 1, wherein the bars have a U-shaped cross-section.

3. A distributor according to claim 2, wherein the upper ends of the bars have an angled flap which can be inserted into a slot provided in the rear wall of the distributor housing.

4. A distributor according to claim 3, wherein lower ends of the bars are equipped with a push-type locking bolt for engaging the rear wall of the distributor housing.

5. A distributor according to claim 4, wherein the bars are provided selectively with openings for receiving plug-in connectors.

6. A distributor according to claim 5, wherein the bars are provided with at least one pair of T-shaped slots for engaging a U-shaped cable holder by means of T-shaped attachments provided at free ends of the cable holder.

7. A distributor according to claim 1, wherein the bottom plate is a removable slide.

8. A distributor according to claim 1, wherein a joint between the door, the distributor housing and the bottom plate is made electromagnetically tight by means of contact springs disposed on at least one of the distributor housing, the door and the bottom plate.

9. An electrical distribution unit comprising:
 an electromagnetically shielded enclosure having top and bottom openings for providing entry of electrical lines to be connected in the unit;
 a cabinet-shaped distributor housing disposed inside the shielded enclosure, the housing being open at a top end thereof, closed on two sides and a rear thereof, and having a door at a front face thereof;
 a plurality of bars which extend vertically along a rear wall inside the housing and are open at a bottom end to form hollow passages for receiving electrical lines entering the unit from the bottom, the bars being closed at a top end thereof, at least some of the bars being adapted to receive plug-in connectors on front faces thereof, the connectors for connection, internal to the bars, to electrical lines entering the unit from the bottom, and for providing plug-in connection, external to the bars, with electrical lines which enter the unit from the top: and a bottom plate disposed at a bottom end of the distributor housing and extending between the sides of the housing from the front face of the housing to front faces of the bars, for closing the bottom end of the housing in front of the bars.

* * * * *

UNITED STATES PATENT AND TRADEMARK OFFICE
CERTIFICATE OF CORRECTION

PATENT NO. : 5,175,673

DATED : December 29th, 1992

INVENTOR(S) : Jacques Roger and Günter Steffen

It is certified that error appears in the above-identified patent and that said Letters Patent is hereby corrected as shown below:

On the title page, Item [30]:
    kindly change application number from "90204830.5" to --90402830.5--.

Signed and Sealed this

Second Day of November, 1993

Attest:

BRUCE LEHMAN

Attesting Officer     Commissioner of Patents and Trademarks